US008343853B2

(12) United States Patent
Koo et al.

(10) Patent No.: US 8,343,853 B2
(45) Date of Patent: Jan. 1, 2013

(54) SEMICONDUCTOR WAFER, SEMICONDUCTOR DEVICE USING THE SAME, AND METHOD AND APPARATUS FOR PRODUCING THE SAME

(75) Inventors: Tae-Hyoung Koo, Incheon (KR); Sam-jong Choi, Suwon-si (KR); Yeonsook Kim, Yongin-si (KR); Taesung Kim, Suwon-si (KR); Heesung Kim, Yongin-si (KR); KyooChul Cho, Yongin-si (KR); Joonyoung Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 462 days.

(21) Appl. No.: 12/588,024

(22) Filed: Oct. 1, 2009

(65) Prior Publication Data
US 2010/0148310 A1 Jun. 17, 2010

(30) Foreign Application Priority Data

Dec. 16, 2008 (KR) .................. 10-2008-0128195

(51) Int. Cl.
*H01L 21/322* (2006.01)
(52) U.S. Cl. .............. 438/471; 438/143; 257/E21.318
(58) Field of Classification Search .............. 257/617, 257/E21.318, E29.107; 438/473; 437/143, 437/407, 471, 511, 797
See application file for complete search history.

(56) References Cited

U.S. PATENT DOCUMENTS

| 5,401,669 | A | 3/1995 | Falster et al. | |
|---|---|---|---|---|
| 6,642,123 | B2 | 11/2003 | Mun et al. | |
| 2002/0020696 | A1* | 2/2002 | Kitamura et al. | 219/390 |
| 2003/0183612 | A1* | 10/2003 | Timans et al. | 219/390 |
| 2004/0053516 | A1 | 3/2004 | Nakada et al. | |
| 2006/0063280 | A1* | 3/2006 | Sohtome | 438/5 |

FOREIGN PATENT DOCUMENTS

KR 10-2004-0103222 A 12/2004

OTHER PUBLICATIONS

Akatsuka, M., et al., "Effect of rapid thermal annealing on oxide precipitation behavior in silicon crystal", Nuclear Instruments and Methods in Physics Research, B186, pp. 46-54, (2002).
Ishisaka, Kazunori, et al., "Gettering Properties of Silicon Wafer Covered by Polysilicon", Nippon Steel Technical Report, No. 59, pp. 11-16, (Oct. 1993).
Kissinger, G., et al., "Denuded zone formation by conventional and rapid thermal anneals", Materials Science and Engineering, B73, pp. 106-110 (2000).

* cited by examiner

*Primary Examiner* — Victor A Mandala
*Assistant Examiner* — Selim Ahmed
(74) *Attorney, Agent, or Firm* — Lee & Morse, P.C.

(57) ABSTRACT

A method of processing a semiconductor wafer includes preheating the wafer to a preheating temperature that is less than a peak temperature, heating the wafer from the preheating temperature to the peak temperature at a first ramp rate that averages about 100° C. per second or more, and, immediately after heating the wafer from the preheating temperature to the peak temperature, cooling the wafer at a second ramp rate that averages about −70° C. per second or more from the peak temperature to the preheating temperature, wherein the peak temperature is about 1,100° C. or more.

7 Claims, 15 Drawing Sheets

Derivative of Temperature Curve

———— Spike RTA (1,250 °C)

------ RTA (1,175°C)

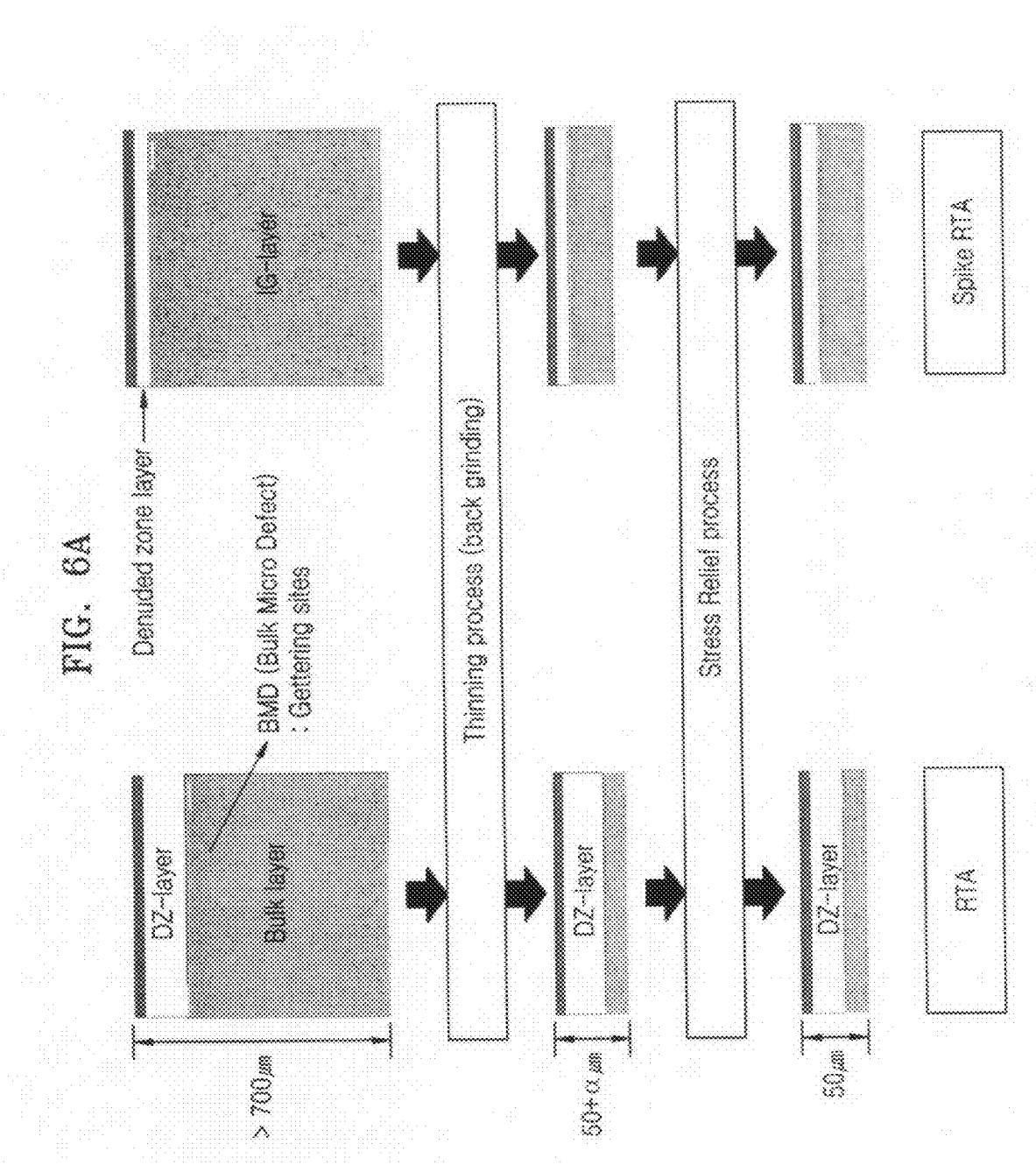

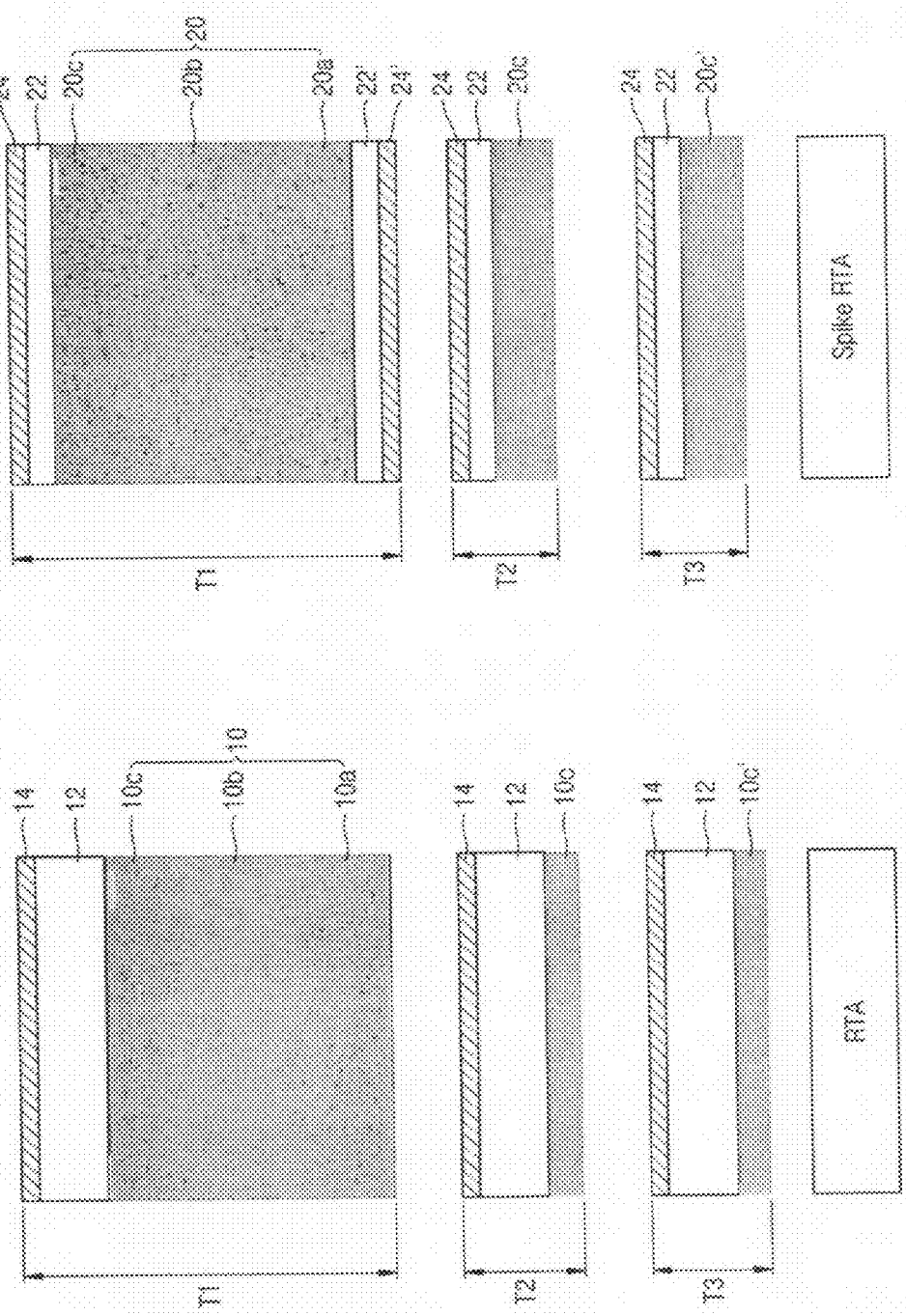

FIG. 8

| | RTA wafer | Anneal wafer | Spike RTA wafer |
|---|---|---|---|
| Heat Treatment | RTA | Furnace Anneal | Spike RTA |
| DZ Depth | 20 to 30 μm | 20 to 30 μm | < 10 μm |
| BMD | 1.00E+09 [counts/cm$^3$] | 1.00E+10 [counts/cm$^3$] | 1.00E+10 [counts/cm$^3$] |
| Gettering Ability | Good | Good | Excellent |
| Cost factor (estimated) | 1.05 | 1.1 | 1 |
| GOI | Good | Good | Good |
| Substrate Type | Pure | Controlled substrate | Pure |
| BMD Profile | M shape | D shape | Asymmetric V shape |
| Issues | Deep DZ | Metal Contamination, Warpage, Slip | — |

FIG. 9
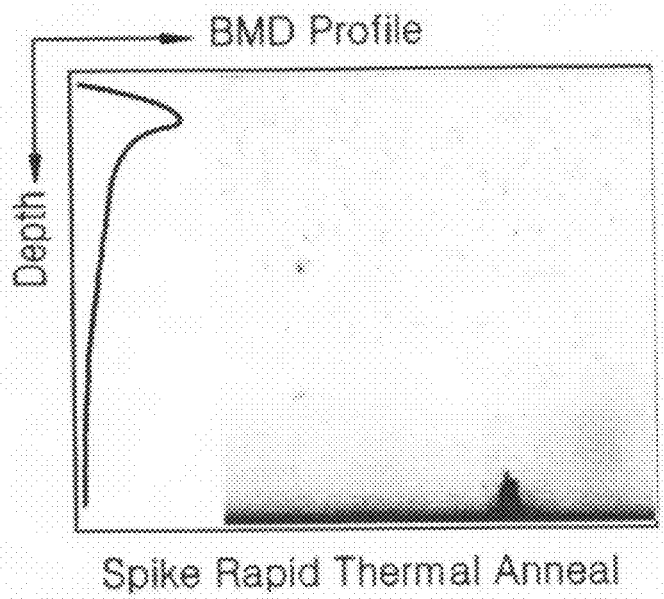
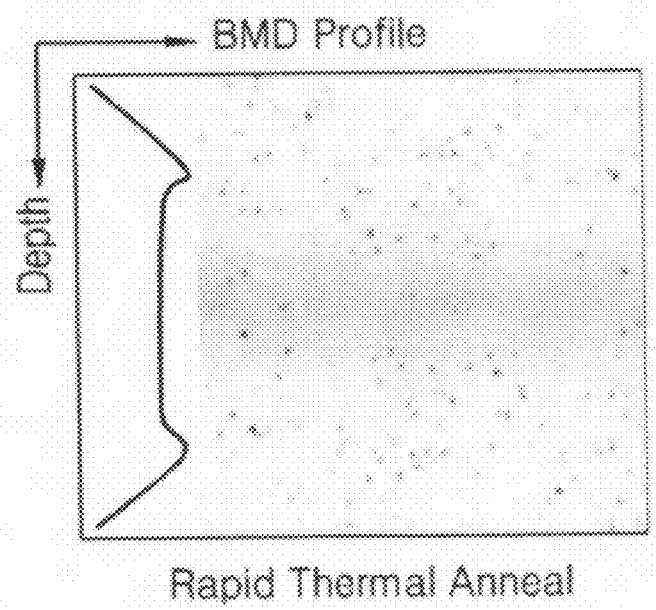

FIG. 11A

| Process Condition | Heat Treatment | Preheating | | Peak Temperature (°C) | Heating (°C/sec) | Cooling (°C/sec) |
|---|---|---|---|---|---|---|
| | RTA | 800 °C | 10 sec | 1,175 | 100 | 33 |
| | Spike RTA | 650 °C | 15 sec | 1,200 | 250 | 75 |
| | Spike RTA | 650 °C | 20 sec | 1,250 | 250 | 80 |
| | Spike RTA | 650 °C | 30 sec | 1,250 | 250 | 85 |
| | Spike RTA | 650 °C | 60 sec | 1,250 | 250 | 85 |

Note: "13+" indicates greater than 13.

FIG. 11B

| | General Outcome | Preheating | | Peak Temperature (°C) | Heating (°C/sec) | Cooling (°C/sec) |
|---|---|---|---|---|---|---|
| Results Regarding BMD Density | Spike RTA >> RTA | 800 °C = 650 °C | Equal for time > 15 sec | 1,250 > 1,200 >> 1,175 | 100 = 250 | 85 > 80 > 75 > 33 |
| Results Regarding Denuded Zone Thickness | RTA > Spike RTA | 800 °C = 650 °C | Equal | 1,175 > 1,200 = 1,250 | 200 = 250 | 33 > 75 > 80 > 85 |
| Results Regarding Uniformity | RTA > Spike RTA | | 20+ sec = 20 sec = 15 sec > 10 sec | | | |

Note: "13+" indicates greater than 13; "20+" indicates greater than 20.

SEMICONDUCTOR WAFER, SEMICONDUCTOR DEVICE USING THE SAME, AND METHOD AND APPARATUS FOR PRODUCING THE SAME

BACKGROUND

1. Field

Embodiments relate to a semiconductor wafer, a semiconductor device using the same, and a method and apparatus for producing the same.

2. Description of the Related Art

Advances in semiconductor technologies, e.g., vertical integration of devices as multi-chip packages (3-dimensional packages), have been leading to requirements for thinner device substrates. However, processing, e.g., thinning, a semiconductor wafer to provide a thin device substrate may eliminate beneficial internal gettering sites (also referred to as intrinsic gettering sites) in the wafer. Further, back side polishing may be required to avoid generating structural defects in a very thin wafer, e.g., in a wafer having a thickness of about 90 µm for a 300 mm wafer and about 50 µm for a 200 mm wafer, as compared to back side grinding that may be used to provide a somewhat thicker wafer. However, back side polishing does not generally provide the rough surface-provided by back side grinding, resulting in a loss of gettering sites provided by the rough surface. These issues may be particularly problematic when devices formed on the substrate use transition metal chemistries, e.g., copper for interconnects, cobalt for gate materials, etc.

SUMMARY

Embodiments are therefore directed to a semiconductor wafer, a semiconductor device using the same, and a method and apparatus for producing the same, which substantially overcome one or more of the problems due to the limitations and disadvantages of the related art.

It is therefore a feature of an embodiment to provide a semiconductor wafer having a predetermined nucleation site profile that provides a high level of internal gettering, a semiconductor device using the same, and a method and apparatus for producing the same.

At least one of the above and other features and advantages may be realized by providing a method of processing a semiconductor wafer, including preheating the wafer to a preheating temperature that is less than a peak temperature, heating the wafer from the preheating temperature to the peak temperature at a first ramp rate that averages about 100° C. per second or more, and immediately after heating the wafer from the preheating temperature to the peak temperature, cooling the wafer at a second ramp rate that averages about −70° C. per second or more from the peak temperature to the preheating temperature. The peak temperature may be about 1,100° C. or more.

The first ramp rate may average about 250° C. per second or more.

Heating the wafer from the preheating temperature to the peak temperature and cooling the wafer may be performed in a combined time of about 4 seconds or less.

The first ramp rate averages about 250° C. per second or more.

The second ramp rate may average about −100° C. per second or more.

Heating the wafer at the first ramp rate may include directing a source of heat at a front surface of the wafer, and cooling the wafer at the second ramp rate may include directing a gas stream at a back surface of the wafer so as to transfer heat from wafer to the gas stream.

The preheating temperature may be about 800° C. or less, and heating the wafer from an initial temperature to the preheating temperature may be performed in a time of about 60 seconds or less.

The preheating temperature may be between about 500° C. and about 800° C.

At least one of the above and other features and advantages may also be realized by providing a method of processing a semiconductor wafer, including preheating the wafer to a first temperature that is less than a peak temperature, heating the wafer from the first temperature to the peak temperature at an instant heating rate that reaches about 100° C. per second or more, and, immediately thereafter, cooling the wafer at an instant cooling rate that reaches about −100° C. per second or more. The peak temperature may be about 1,100° C. or more. The instant heating rate is the first derivative of a temperature/time curve during the heating of the wafer, and the instant cooling rate is the first derivative of a temperature/time curve during the cooling of the wafer.

At least one of the above and other features and advantages may also be realized by providing a semiconductor chip having a semiconductor substrate and a least one device on an active surface of the substrate. The semiconductor substrate may include a denuded zone below the at least one device, and the semiconductor substrate may include an internal gettering region below the denuded zone, the internal gettering region including a first region in which a bulk microdefect density is at a maximum, the first region being proximate to the denuded zone, and a second region below the first region and contiguous with the first region, a bulk microdefect density in the second region decreasing monotonically from the maximum to a back surface of the semiconductor substrate.

The denuded zone may have a thickness of about 15 µm or less.

A plot of bulk microdefect densities in the semiconductor substrate may show a single maximum.

The bulk microdefect density may be at a maximum proximate to the denuded zone.

At least one of the above and other features and advantages may also be realized by providing a semiconductor chip having a semiconductor substrate and a least one device on an active surface of the substrate. The semiconductor substrate may include a denuded zone below the at least one device, the semiconductor substrate may include an internal gettering region below the denuded zone, and the denuded zone may have a thickness of about 20 µm or less.

The denuded zone may have a thickness of about 15 µm or less.

The denuded zone may have a thickness of about 10 µm or less.

At least one of the above and other features and advantages may also be realized by providing a semiconductor wafer, including a first surface configured for the formation of active devices thereon, a bulk region, and nucleation sites in the bulk region. A profile of the nucleation sites in the bulk region may be predetermined to generate a denuded zone just below the first surface, and the nucleation site profile may be asymmetric and at a maximum concentration at a depth proximate to the first surface.

The wafer may be a thinned wafer having a thickness of less than 100 µm, and a denuded zone generated by developing bulk microdefects from the nucleation site profile may have a thickness of about 15 µm or less.

At least one of the above and other features and advantages may also be realized by providing a semiconductor wafer, including a predetermined nucleation site profile, which, upon thermal treatment, produces a bulk microdefect profile, the bulk microdefect profile including a denuded zone below a first surface of the wafer, and an internal gettering region below the denuded zone. The internal gettering region may include a first region in which bulk microdefect density is at a maximum, the first region being proximate to the denuded zone, and a second region below the first region and contiguous with the first region, a bulk microdefect density in the second region decreasing from the maximum to a back surface of the semiconductor substrate.

At least one of the above and other features and advantages may also be realized by providing an apparatus for generating a predetermined nucleation site profile in a semiconductor wafer, the apparatus including a heating unit configured to heat a front surface of a wafer being processed from a preheating temperature to a peak temperature at a first ramp rate of about 100° C. per second or more, and a cooling unit configured to cool a back surface of the wafer being processed immediately after the heating unit heats the front surface, the cooling unit being configured to cool the wafer at a second ramp rate of about −70° C. per second or more.

The heating unit may be set to heat the front surface of the wafer being processed to a peak temperature of about 1,100° C. or more.

BRIEF DESCRIPTION OF THE DRAWINGS

The above and other features and advantages will become more apparent to those of ordinary skill in the art by describing in detail example embodiments with reference to the attached drawings, in which:

FIGS. 6A and 6B illustrate structural differences between a wafer processed using rapid thermal anneal and a wafer processed using spike rapid thermal anneal according to an embodiment;

FIG. 8 illustrates a table showing differences between wafers processed using rapid thermal anneal, a long anneal, and spike rapid thermal anneal according to an embodiment, respectively;

FIG. 9 illustrates profile differences between a wafer processed using spike rapid thermal anneal according to an embodiment and a wafer processed using rapid thermal anneal;

FIGS. 11A and 11B illustrate data comparing wafer processing conditions and resultant wafer characteristics for spike rapid thermal anneal according to an embodiment and rapid thermal anneal;

DETAILED DESCRIPTION

Figure 1:
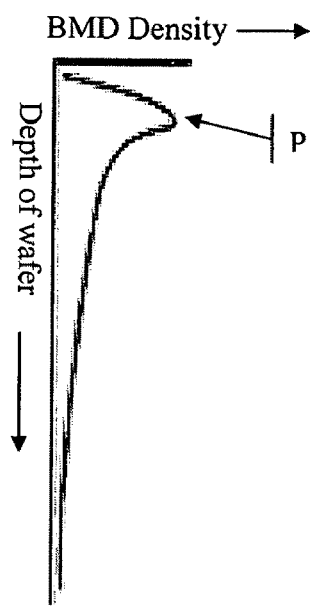
FIG. 1 illustrates a bulk microdefect profile produced by a predetermined nucleation site profile according to an embodiment.

Korean Patent Application No. 2008-0128195, filed on Dec. 16, 2008, in the Korean Intellectual Property Office, and entitled: "Silicon Wafer Capable of Improving Gettering Effect and Semiconductor Device Using the Silicon Wafer, Method of Heating and Manufacturing Thereof, and Apparatus for Heating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

An embodiment is directed to a semiconductor wafer having a predetermined nucleation site profile and a method of producing the same that includes a spike rapid thermal anneal. The semiconductor wafer may a silicon wafer, which may be initially formed using, e.g., a Czochralski process, and then processed using the spike rapid thermal anneal according to an embodiment.

Nucleation sites forming the nucleation site profile in the wafer according to an embodiment may be, e.g., strain centers in a crystal lattice of the wafer. The strain centers may be the result of crystal defects resulting from, e.g., lattice vacancies, substitutional impurities, and/or interstitial impurities within the crystal.

The nucleation site profile in a wafer according to an embodiment may be asymmetric. The spike rapid thermal anneal may employ a high heating rate and a high cooling rate. Developing the asymmetric profile in the wafer may be aided by back side cooling as part of the spike rapid thermal anneal.

Referring to FIG. 1, the predetermined nucleation site profile may produce a desired asymmetric bulk microdefect ("BMD") profile in the wafer when the wafer having the predetermined nucleation site profile is subjected to a thermal treatment. The BMD profile reflects a density of BMDs in the wafer. The predetermined nucleation site profile may produce, during device fabrication, a BMD zone that provides internal gettering sites and a thin denuded zone beneath the active surface of the wafer.

The BMD profile may be asymmetric with respect to the front and back surfaces of the wafer, with the thin denuded zone at the front surface. The BMD zone and associated gettering sites may thus begin close to the active surface of the wafer. For example, the BMD zone may be separated from the active surface of the wafer by the thin denuded zone having a thickness of, e.g., about 15 µm. In particular implementations, the denuded zone may have a thickness of 15 µm, less than 15 µm, etc. Thus, the BMD zone may provide gettering sites close to the active surface, i.e., the device surface, of the wafer.

The BMD profile may exhibit a single peak BMD concentration "P" in a region near the front side of the wafer (the front side of the wafer being the active surface used to form devices). The BMD concentration may decrease from the BMD concentration profile peak "P" with increasing depth of the wafer. In an implementation, the BMD concentration may decrease continuously from the BMD concentration profile peak "P" through the depth of the wafer to the back side of the wafer.

Figure 2A:
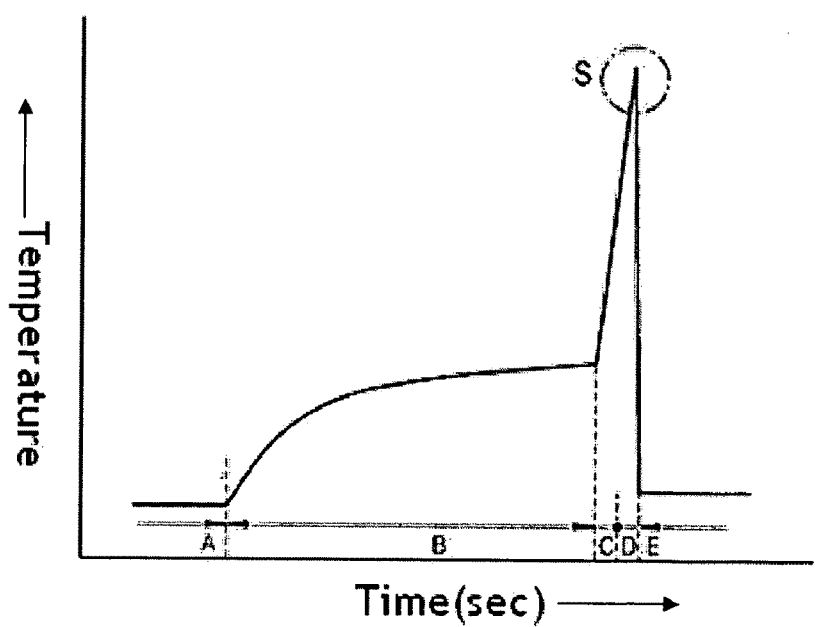
FIGS. 2A, 2B and 2C illustrate an example temperature curve for a spike rapid thermal anneal according to an embodiment, an example temperature curve for a general rapid thermal anneal, and an example temperature curve for a general long anneal, respectively.

Referring to FIG. 2A, a peak temperature (identified as temperature "S" in FIG. 2A) at the front side of the wafer during the spike rapid thermal anneal may be, e.g., about 1,100° C. to about 1,250° C. In an implementation, the wafer may be maintained at the peak temperature "S" for a period of less than 1 second and then rapidly cooled.

In an implementation, the spike rapid thermal anneal may include preheating the wafer from a starting temperature, identified as the temperature up to point "A" in FIG. 2A, e.g., room temperature, to a preheat temperature over period "B" in FIG. 2A, then rapidly heating the wafer from the preheat temperature to the peak temperature "S" at a temperature ramp rate of, e.g., greater than 100° C./second, over period "C" in FIG. 2A, then quenching the wafer by rapidly cooling the wafer from the peak temperature at a rate of, e.g., greater than −100° C./second, over period "D" in FIG. 2A. The final temperature, identified as the temperature during period "E" in FIG. 2A, may be the same as, greater than, or less than the starting temperature.

In further detail, during period "A," the wafer may be loaded into the spike rapid thermal anneal processing chamber. The temperature of the wafer during period "A" may be, e.g., room temperature, i.e., about 25° C.

During period "B," the wafer may be preheated from the starting temperature to a preheating temperature of, e.g., about 650° C. to about 800° C. Preheating during period "B" may help reduce the likelihood of cracks being formed in the wafer during subsequent temperature ramps. In the case that a wafer having impurities (dopant) doped therein is being processed, it may be desirable to set the preheating temperature to about 800° C. or less in order to minimize out-diffusion of the dopant from the wafer. The duration of period "B" may be, e.g., about 15 seconds to about 60 seconds. In an implementation, the duration of period "B" may be about 15 seconds to about 20 seconds.

During period "C," the wafer may be rapidly heated. The rapid heating during period "C" may increase the temperature of the front side of the wafer from the preheating temperature to the peak temperature "S," which may be, e.g., about 1,100° C. to about 1,250° C. In an implementation, the peak temperature "S," may be about 1,200° C. to about 1,250° C.

In the case that a wafer having impurities (dopant) doped therein is being processed, it may be desirable to set the peak temperature "S" to less than about 1,300° C. in order to minimize out-diffusion of the dopant from the wafer. Further, a peak temperature "S" of less than about 1,300° C. may help reduce the likelihood of surface damage and cracking occurring in the wafer.

Figure 3A:
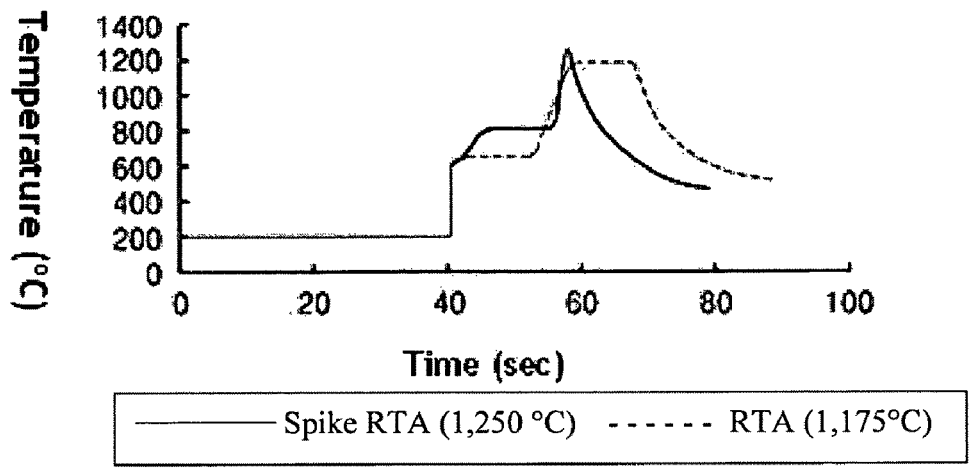
FIGS. 3A and 3B illustrate temperature and first derivative curves, respectively, for a spike rapid thermal anneal according to an embodiment and a comparative rapid thermal anneal.
Figure 3B:
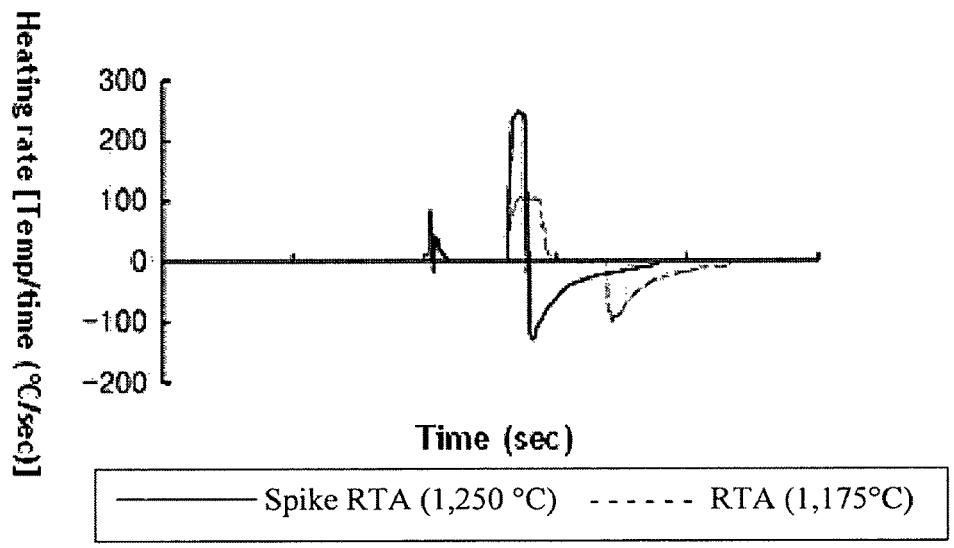

During period "C," the rate of increase of the temperature of the front side of the wafer may average more than about 80° C./second, e.g., about 100° C./second or more. Preferably, the rate of increase of the temperature of the front side of the wafer may average more than about 250° C./second over the course of period "C." Further, the instant heating rate, i.e., the instantaneous rate of change of the temperature, which may be determined as the first derivative of the temperature/time heating curve, i.e., dT/dt, may also reach 250° C./second or more, as shown in FIGS. 3A and 3B. The duration of period "C" may be determined based on the preheating temperature, the peak temperature "S", and the heating rate during period "C," and may be, e.g., less than 5 seconds.

In an implementation, back side cooling may be employed immediately following front side heating, such that the back side cooling is applied immediately following the steep heating ramp (heating ramp region "C" in FIG. 2A). In another implementation, the commencement of back side cooling may begin before front side heating has completed, such that the back side cooling operation may overlap with the front side heating operation.

During period "D," the rate of decrease of the temperature of the front side of the wafer may average about −70° C./second or more. In various implementations, the rate of decrease of the temperature may be more than −70° C./second, about −75° C./second, about −80° C./second, about −85° C./second, or more. The instant cooling rate (derivative of temperature/time curve during cooling) may reach about −100° C./second or more. These cooling values differ significantly from those used in a general rapid thermal anneal process, and have a large impact on the development of the predetermined nucleation site profile that is a unique characteristic of a wafer formed according to an embodiment.

The duration of period "D" may be determined based on the peak temperature "S," the end temperature, and the cooling rate during period "D." The end temperature may be, e.g., less than the preheating temperature. In an implementation, the wafer may be cooled from the peak temperature to a temperature at or below the preheat temperature, in which case the average cooling rate, e.g., about −75° C./second, about −80° C./second, about −85° C./second, or more, may be determined based on the period from the peak temperature to the preheat temperature, which is a sub-period of period "D." In another implementation, the end temperature may be at or near room temperature.

Figure 2B:
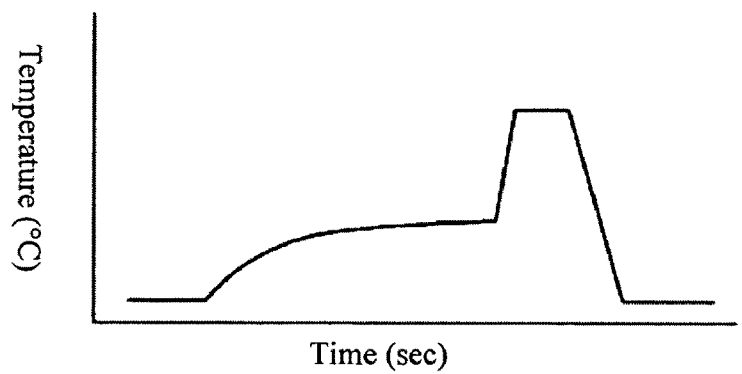

The duration of period "D" may be, e.g., less than 2 seconds, preferably about 1 second to about 1.5 seconds. By way of comparison, as shown in FIG. 2B, an example temperature curve of a general rapid thermal anneal includes a relatively long duration, e.g., 10 to 20 seconds or more, at peak temperature, and a relatively slow, e.g., 1 to 2 minutes or more, cooling ramp. Moreover, the peak temperature of a general rapid thermal anneal is less than that of the spike rapid thermal anneal described above in connection with FIG. 2A, e.g., 1,100° C. for the general rapid thermal anneal at peak, as compared to more than 1,000° C., e.g., 1,200° C., 1,250° C., or more, for spike rapid thermal anneal. Further, the general rapid thermal anneal may cool the wafer much more slowly, e.g., −30°, that the high cooling rate employed in the spike rapid thermal anneal according to an embodiment, which may be about −75° C. or more.

Figure 2C:
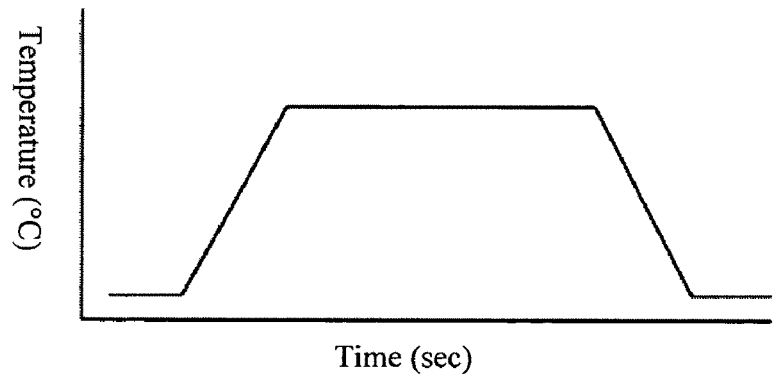

As an additional comparison, as shown in FIG. 2C, an example temperature curve of a general long anneal includes a very long duration, e.g., 1 or 2 hours, at peak temperature, with slow heating and cooling ramps. In the general long anneal, the peak temperature may be about 1,000° C.

In further detail, referring again to FIGS. 3A and 3B, the spike rapid thermal anneal according to an embodiment may employ a faster heating rate, a higher peak temperature, a shorter time at peak temperature, and a faster cooling rate than a general rapid thermal anneal ("RTA" shown as a dashed line in FIGS. 3A and 3B). For example, the heating rate during period "C" of the spike rapid thermal anneal may average more than about 250° C./second, whereas a general rapid thermal anneal may employ a slower heating rate averaging about 75 to 100° C./second. Further, the instant heating rate during period "C" of the spike rapid thermal anneal may reach as much as 250° C./second or more, whereas a general rapid thermal anneal may employ a slower instant heating rate of less than 100° C./second. The cooling rate during period "C" of the spike rapid thermal anneal may average more than about −75° C./second, whereas the general rapid thermal anneal may employ a slower cooling rate averaging less than about −33° C./second. Further, the instant cooling rate during period "C" of the spike rapid thermal anneal may reach about −100° C./second or more, whereas a general rapid thermal anneal may employ a slower instant cooling rate of less than −100° C./second.

According to this embodiment, the time at which the front side of the wafer is at the peak temperature "S" may be less than about 1 second. As a particular example, a spike rapid thermal anneal according to an embodiment may result in a peak temperature at the front side of the wafer being 1,250° C., where a total time the front side of the wafer excees 1,200° C. is about 1 second, e.g., 1.08 seconds.

Figure 4A:
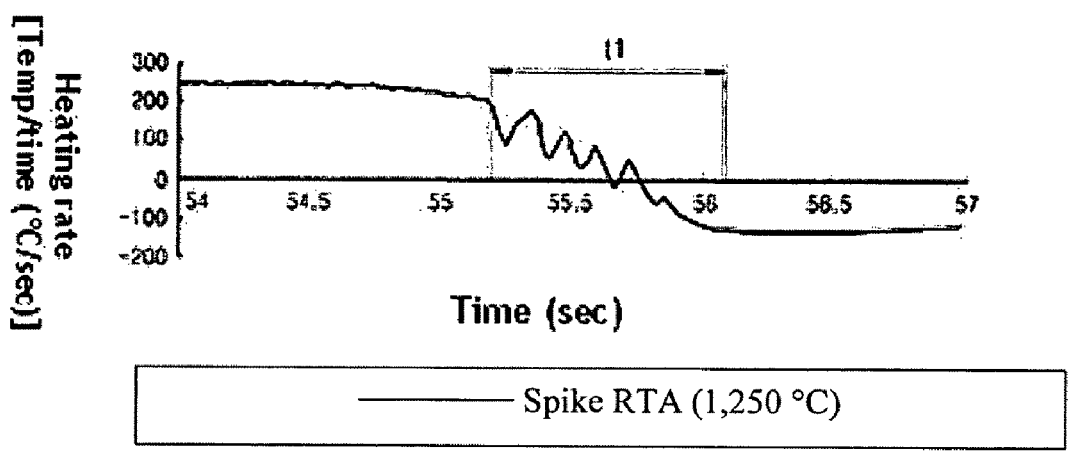
FIGS. 4A and 4B illustrate magnified portions of first derivative curves for a spike rapid thermal anneal according to an embodiment and a comparative rapid thermal anneal, respectively.
Figure 4B:
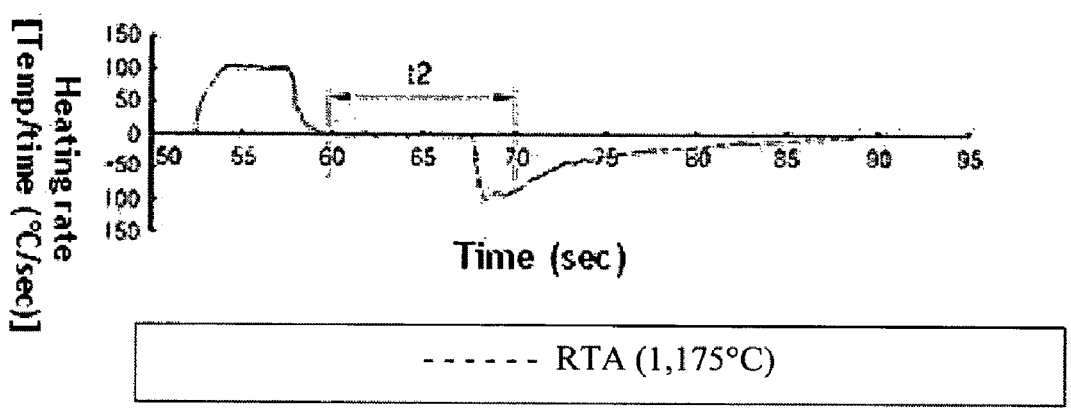

In contrast, as discussed above, a general rapid thermal anneal may maintain a wafer at peak temperature for a period of 10 seconds to 20 seconds, or more. Aiding in the short time at the peak temperature "S," the spike rapid thermal anneal may employ a very rapid transition to cooling after the peak temperature "S" is reached. FIG. 4A illustrates a magnified portion of the derivative temperature curve of FIG. 3B for the spike rapid thermal anneal according to an embodiment. Referring to FIG. 4A, in an implementation, the duration of transition period "t1" of the spike rapid thermal anneal, which reflects the transition from the maximum instant heating rate to the maximum instant cooling rate, may be less than about 2 seconds, e.g., about 1 second. In contrast, a period "t2" in FIG. 4B, which reflects the time at peak temperature and transition to maximum cooling of a general rapid thermal anneal, may be about 10 seconds.

The spike rapid thermal anneal according to an embodiment may not only produce the predetermined nucleation site profile, it may also reduce or eliminate the generation of defects in wafer topology. For example, the spike rapid thermal anneal may reduce or eliminate the generation of wafer warpage, slip faults, and surface damage that would be generated if the wafer were subjected to a long annealing process. Further, the spike rapid thermal anneal according to an embodiment may shorten wafer processing times, thereby minimizing the time the wafer is in a processing chamber so as to reduce the likelihood and/or extent of metal contamination from the processing chamber.

The method of producing the wafer having the predetermined nucleation site profile may use as a starting material a high-grade semiconductor wafer, e.g., a prime and/or polished silicon wafer, although other, e.g., lower, grade wafers may be used. It will be appreciated that the use of high-grade wafers in an extended annealing process, rather than the spike rapid thermal anneal process, may be wasteful, because the extended annealing process may degrade the initially-high quality of the wafer.

Analysis of Predetermined Nucleation Site Profile

The predetermined nucleation site profile of a wafer formed according to an embodiment may be determined by: (a) providing the wafer having the predetermined nucleation site profile, (b) thermally treating the wafer to convert the nucleation site profile to a BMD profile, and (c) examining the BMD profile.

With respect to (a), the wafer may be formed to have a predetermined nucleation site profile according to embodiments described herein.

With respect to (b), the thermal treatment, for the purposes of analyzing the BMD profile, may include heating the wafer having the nucleation site profile to a first temperature of about 800° C. and maintaining the temperature of about 800° C. for about 4 hours, then heating the wafer to a second temperature of about 1,000° C. and maintaining the temperature of about 1,000° C. for about 16 hours. It will be appreciated, however, that the BMD profile may be formed from the nucleation site profile using other processes including, e.g., one or more sequential semiconductor device fabrication processes having a combined thermal budget sufficient to convert the nucleation site profile to the BMD profile.

With respect to (c), once thermal treatment has produced the BMD profile in the wafer, the BMD profile may be examined by, e.g., cleaving and etching the wafer and then examining the wafer using a microscope at, e.g., 500× magnification. Etching the wafer may include using an oxidative etchant, e.g., a Wright etchant or a Secco etchant. The Secco etchant may include, e.g., a 1:2 volume ratio of potassium dichromate ($K_2Cr_2O_7$) (0.15 molar):HF, respectively. Laser scattering may also be used, e.g., through back side irradiation. The use of Wright and Secco etchants in this manner, laser scattering, as well as other processes, are described in U.S. Pat. No. 6,638,357, the entire content of which is incorporated by reference herein in its entirety and for all purposes. The Wright etchant is also described in "A New Preferential Etch For Defects In Silicon Crystals,", by M. W. Jenkins, *J. Electrochem. Soc., Solid-State Science and Technology*, p. 757, May 1997. The Secco etchant is also described by F. Secco d'Aragona in *J. Electrochem. Soc.*, Vol. 119, No. 7, p. 948 (1972).

Etch-based processes may not provide information on microdefects having diameters less than 5 μm. In contrast, laser-based processes may provide information on microdefects having diameters less than 5 μm. Upon examination of the microdefects using either etch or laser-based processes, the BMD profile and the thickness of the denuded zone may be determined. Herein, the denuded zone is a defect-free region, defined as having no defects with diameters in the 0 to 10 μm range. Thus, the thickness of the denuded zone can be determined using either etch or laser-based processes.

Figure 5:
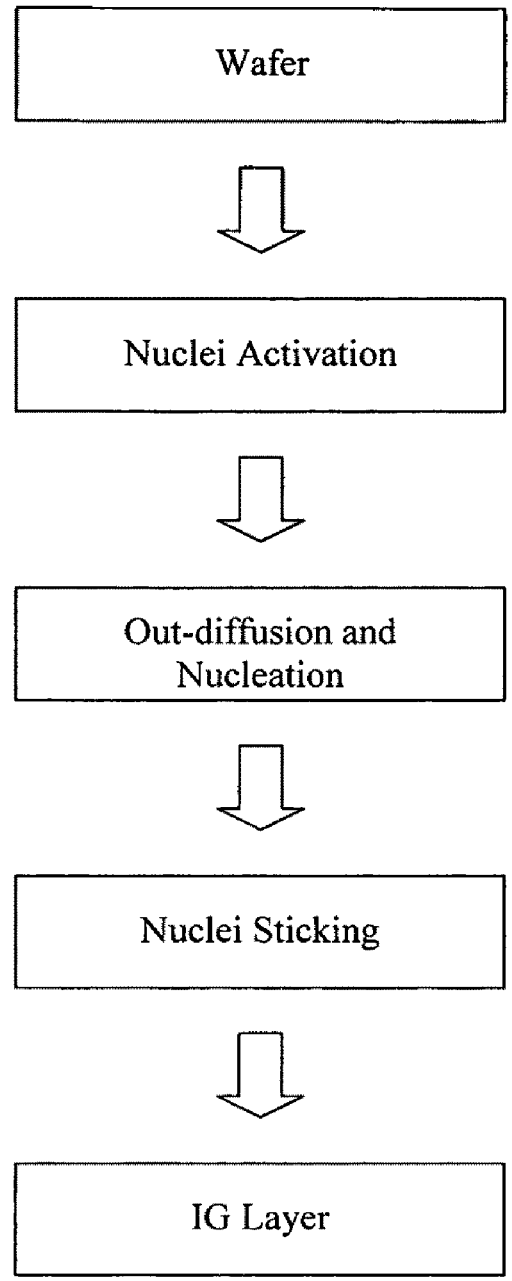
FIG. 5 illustrates stages of development of wafer characteristics during wafer processing using spike rapid thermal anneal according to an embodiment.

FIG. 5 illustrates stages of development of wafer characteristics during wafer processing using spike rapid thermal anneal according to an embodiment. Referring to FIG. 5, the spike rapid thermal anneal may activate nuclei, and then out-diffusion and nucleation my result in vacancies diffusing out of the denuded zone. Quenching according to an embodiment, i.e., rapid cooling, may produce nuclei sticking, whereas slower methods may undesirably result in nuclei agglomeration or dissolution. The final stage in FIG. 5 indicates the presence of internal gettering (IG) sites in a wafer processed according to an embodiment.

FIGS. 6A and 6B illustrate structural differences between a wafer processed using rapid thermal anneal and a wafer processed using spike rapid thermal anneal according to an embodiment. FIG. 6A illustrates the structural differences in the context of wafer thinning and stress relief processing operations. Referring to FIG. 6A, the left side indicates the wafer processed using rapid thermal anneal, and the right side indicates the wafer processed using spike rapid thermal anneal according to an embodiment. As shown in FIG. 6A, the wafer thickness may initially be about 700 μm or more. Thinning (back side grinding and/or back side polishing) and stress relief (polishing, removing a thickness 'a') may reduce the final wafer thickness to, e.g., about 50 μm in the thinned wafer. The thick denuded zone layer ("DZ layer") formed using the rapid thermal anneal occupies a very large portion of the thickness of the wafer in the left side of the figure. In contrast, the denuded zone formed using spike rapid thermal anneal according to an embodiment is thin, such that, even in the thinned wafer, the wafer on the right side retains a significant portion of the BMD sites that provide advantageous internal gettering effects for the active device area, which may be the upper 15 μm of the wafer thickness.

FIG. 6B is a schematic diagram illustrating additional details of the structural differences between the wafer processed using rapid thermal anneal and the wafer processed using spike rapid thermal anneal according to an embodiment. Referring to FIG. 6B, the wafers may have bulk regions 10 and 20, respectively, denuded zones 12 and 22, respectively, and native oxides 14 and 24, respectively. The native oxides 14, 24 are located at the active surface of the wafers. The wafers may have an initial thickness T1 of about 700 μm or more. After the thinning operation, e.g., after back side grinding, the wafers may have a thickness T2 of about 50 μm plus the amount 'a'. After the stress relief process, the wafers may have a thickness T3 of about 50 μm, i.e., the stress relief process may remove an amount of material sufficient to reduce the wafer thickness by 'a'. The thinning and stress relief operations may remove portions 10a, 10b, 20a, and 20b of the bulk regions, leaving portions 10c and 20c of the respective bulk regions.

Figure 7:
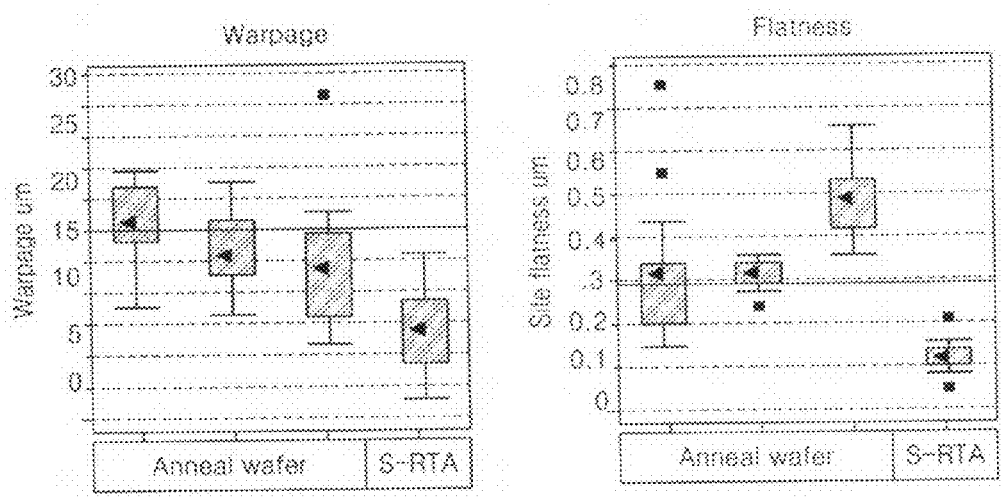
FIG. 7 illustrates differences in warpage and flatness between wafers processed using a long anneal and wafers processed using spike rapid thermal anneal according to an embodiment.

FIG. 7 illustrates differences in warpage and flatness between wafers processed using a long anneal and wafers processed using spike rapid thermal anneal according to an embodiment. Referring to FIG. 7, the long anneal may be used to remove surface defects from a wafer and to form a denuded zone layer. However, the long anneal may also introduce structural defects such as slip, warpage, and surface damage. Further, the long anneal may be costly and may increase the possibility of metal contamination due to the length of the process. In contrast, spike rapid thermal anneal according to an embodiment may maintain good wafer topology. As a result, high grade wafers may be employed in the spike rapid thermal anneal according to an embodiment. The spike rapid thermal anneal according to an embodiment may generate the desired predetermined nucleation site profile that provides high levels of bulk microdefects while, at the same time, provides a thin denuded zone.

FIG. 8 illustrates a table showing differences between wafers processed using rapid thermal anneal, a long anneal, and spike rapid thermal anneal according to an embodiment, respectively.

Referring to FIG. 8, it is apparent that the spike rapid thermal anneal according to an embodiment may provide a shallow denuded zone as compared to rapid thermal anneal and long anneal processes. Further, BMD levels in a wafer processed using spike rapid thermal anneal may be an order of magnitude higher than those obtained using a general rapid thermal anneal, and the wafer processed using spike rapid thermal anneal may afford better gettering properties than wafers processed using either rapid thermal anneal or long anneal processes. Gettering may also be improved by the spike rapid thermal anneal according to an embodiment as a result of non-zero BMD levels beginning closer to the active surface as a result of the thin denuded zone, and as a result of a peak concentration of BMDs closer to the active surface, as compared to BMD profiles produced by a general rapid thermal anneal, as discussed in detail below in connection with FIG. 9.

Additional advantages may also be provided by the spike rapid thermal anneal according to an embodiment. For example, costs involved in the spike rapid thermal anneal according to an embodiment may be lower, e.g., as a result of reduced processing time, than those of either rapid thermal anneal or long anneal processes. Gate oxide integrity (GOI) of a wafer processed using spike rapid thermal anneal according to an embodiment may be of the same quality as obtained by either a general rapid thermal anneal or a long anneal process. Further, the wafer used as starting material for the spike rapid thermal anneal according to an embodiment may be a normal pure wafer (i.e., a high grade wafer—low crystal originated particle (COP) or no COP, high surface quality, initial oxygen concentration of 9 to 12 ppma), whereas a long anneal process may employ a lower-grade wafer (i.e., a "controlled substrate"—high COP, high initial oxygen concentration, such as a wafer from a silicon ingot produced by fast pulling).

FIG. 9 illustrates BMD profile differences between a wafer processed using spike rapid thermal anneal according to an embodiment and a wafer processed using rapid thermal anneal. Referring to FIG. 9, it is apparent that spike rapid thermal anneal according to an embodiment may provide an asymmetric BMD profile generally having a 'V' shape, whereas rapid thermal anneal may provide a symmetric BMD profile having an 'M' shape. As described above and as shown in FIG. 9, the BMD profile in a wafer processed using spike rapid thermal anneal according to an embodiment may have a thin denuded zone, e.g., about 15 μm or less, preferably about 7 to about 10 μm, and a peak BMD level near the active surface, whereas the BMD profile in a wafer processed using rapid thermal anneal may have a deeper denuded zone and a peak BMD level that is significantly farther from the active surface. An active region of a wafer may be about 7 μm thick. Accordingly, it is may be preferable that the denuded zone of the wafer processed using spike rapid thermal anneal be greater than about 7 μm thick, so as to be thicker than the active region and thus provide a defect-free region between the active region and the BMD zone.

Figure 10A:
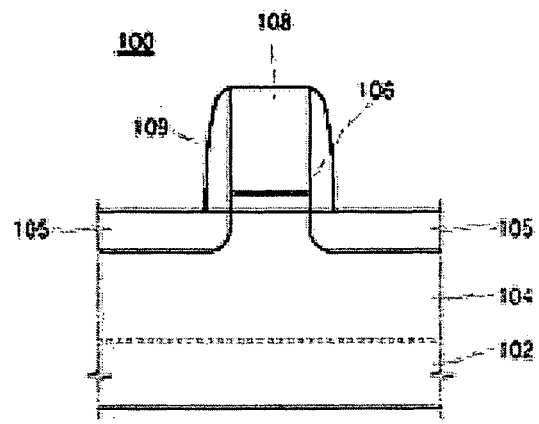
FIGS. 10A-10E illustrate example devices and systems to which wafers processed using spike rapid thermal anneal may be applied.

FIGS. 10A-10E illustrate example devices and systems to which wafers processed using spike rapid thermal anneal may be applied. FIG. 10A illustrates a transistor 100. The transistor 100 may be formed on a wafer having a shallow denuded zone, the substrate being processed using spike rapid thermal anneal according to an embodiment. The transistor 100 may include a bulk region 102 having BMDs, an active region 104, source/drain regions 105, a gate insulator 106, a gate electrode 108, and gate spacers 109.

Figure 10B:
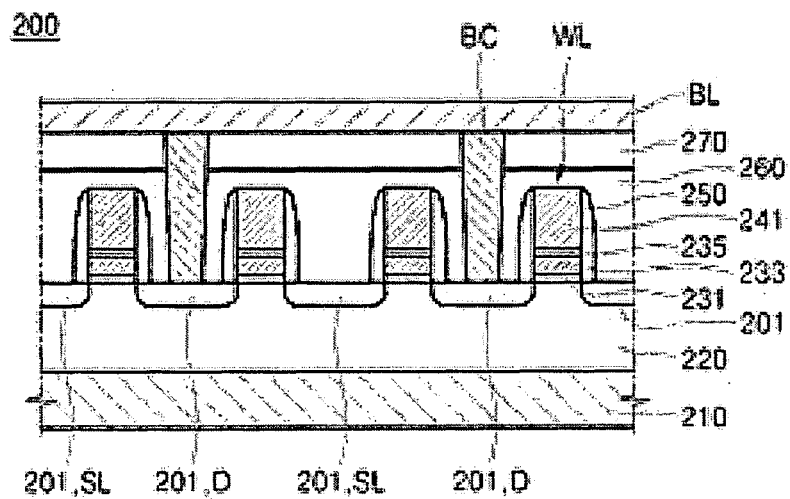

FIG. 10B illustrates a NOR device 200, e.g., as implemented in a flash memory. The NOR device 200 may be formed on a wafer having a shallow denuded zone, the substrate being processed using spike rapid thermal anneal according to an embodiment. The NOR device 200 may include a substrate having a bulk region 210 having BMDs, an active region 220, and impurity doped regions 201. The NOR device 200 may further include gate insulators 231, charge storing layers 233, blocking layers 235, gate electrodes 241, gate spacers 250, interlayer dielectric layers (ILDs) 260, 270, one or more word lines 'WL', bit line contacts 'BC', and one or more bit lines 'BL'.

Figure 10C:
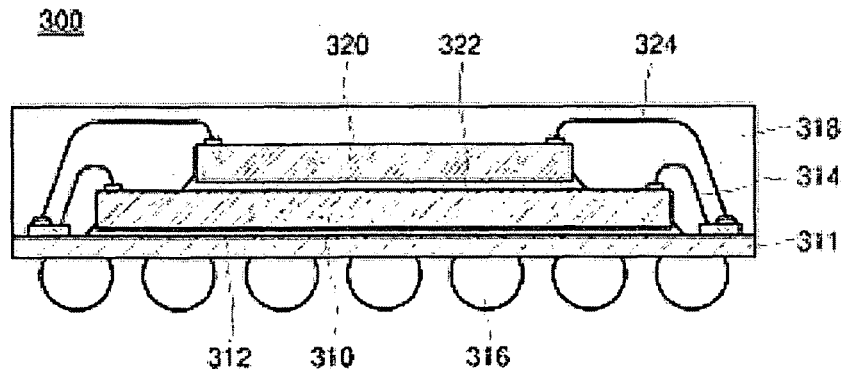

FIG. 10C illustrates a multi-chip package ("MCP") 300 including one or more chips 310, 320 that are formed on wafers having a shallow denuded zone and processed using spike rapid thermal anneal according to an embodiment. The MCP 300 may include a circuit substrate 311, which may be, e.g., a printed circuit board, an interposer, another chip, etc. Chips in the MCP 300 may be bonded using, e.g., adhesive layers 312, 322, and may be electrically interconnected using, e.g., bonding wires 314, 324. Connections to external circuits may be provided by, e.g., solder balls 316, which may be on a bottom surface of the circuit substrate 311. The components of the MCP 300 may be enclosed and protected using a molding compound 318.

Figure 10D:
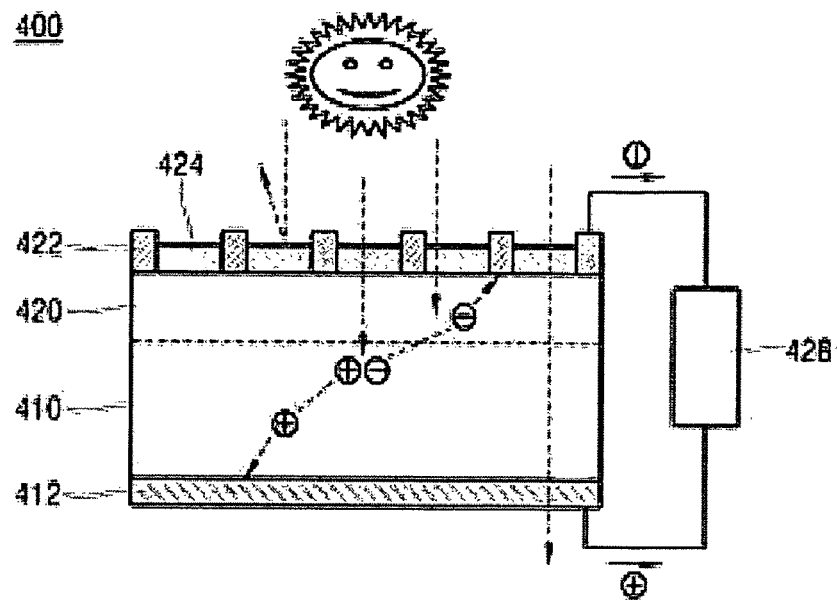

FIG. 10D illustrates a photovoltaic device 400 formed on a wafer having a shallow denuded zone and processed using spike rapid thermal anneal according to an embodiment. Referring to FIG. 10D, the photovoltaic device 400 may include a first semiconductor region 410 of a first conductivity type (n-type or p-type) and a second semiconductor region 420 of a second conductivity type (p-type or n-type). The photovoltaic device 400 may further include a first electrode 412, a second electrode 422, and an antireflection layer 424. External light, e.g., sunlight, impinging on the photovoltaic device 400 may generate holes '+' and electrons '−' in the semiconductor layers so as to drive an external electrical load 428.

Figure 10E:
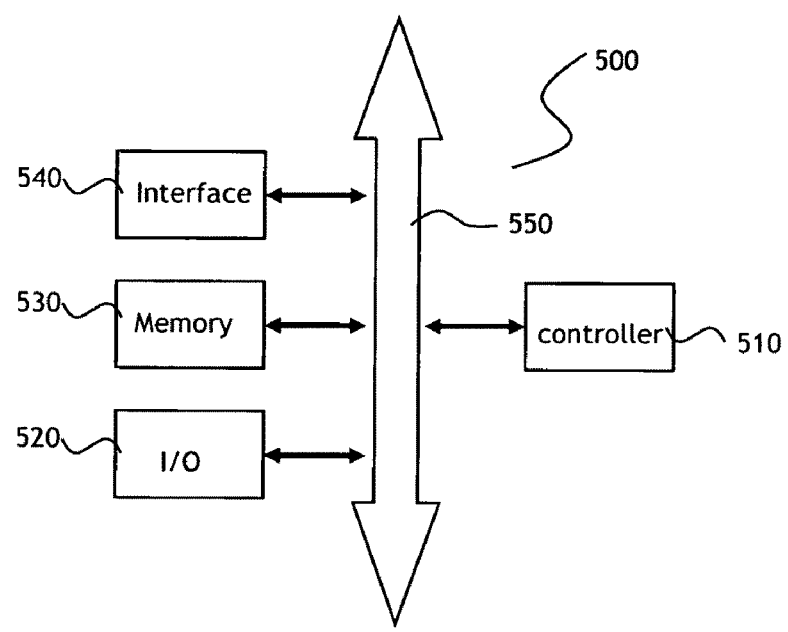

FIG. 10E illustrates a system 500 including one or more devices formed on wafers having a shallow denuded zone and processed using spike rapid thermal anneal according to an embodiment. Referring to FIG. 10E, the system 500 may be used in, e.g., a mobile system such as a personal digital assistant ("PDA"), a portable computer, a web tablet, a wireless phone, a mobile phone, a digital music player, a memory card, a system transmitting and/or receiving information, etc. The system 500 may include a controller 510, an input/output ("I/O") device 520 such as a keypad, a keyboard, a display, a haptic device, etc. The system 500 may include a memory 530 and an external interface 540, e.g., a universal serial bus (USB) port communicating via a bus 550, which may also interconnect the controller 510 and the I/O device 520. The controller 510 may include, e.g., a microprocessor, a digital signal processor, a microcontroller, etc. The memory 530 may store commands executed by the controller 510 and/or data processed by the controller 510. The memory 530 may include, e.g., a flash memory. The system 500 may use the interface 540 for transmitting data into a communication network or receiving data from the network.

The following Examples are provided in order to set forth particular details of one or more example embodiments. However, it will be understood that the embodiments described herein are not limited to the particular details described in the Examples.

EXAMPLES

FIGS. 11A and 11B illustrate data comparing wafer processing conditions and resultant wafer characteristics for spike rapid thermal anneal according to an embodiment and rapid thermal anneal. In particular, FIG. 11A illustrates wafer processing conditions. Heating and cooling rates listed in FIG. 11A are average rates, rather than instant, i.e., first derivative, rates.

FIG. 11B illustrates effects on BMD values, denuded zone thickness, and wafer uniformity for wafers processed according to the various conditions listed in FIG. 11A. In FIG. 11B, the ">" symbol indicates "greater than" and the ">>" symbol indicates "much greater than." Thus, for the BMD density results, "Spike RTA>>RTA" indicates that the BMD density in wafers processed according to the spike rapid thermal anneal conditions in FIG. 11A was much greater than the BMD density in wafers processed according to the rapid thermal anneal conditions in FIG. 11A. Additionally, for the BMD density results, "1,250>1,200>>1,175" indicates that the BMD density in wafers processed at a peak temperature of 1,250° C. was greater than the BMD density in wafers processed at a peak temperature of 1,200° C., which was, in turn, much greater than the BMD density in wafers processed at a peak temperature of 1,175° C.

Similarly, for the denuded zone thickness results in FIG. 11b, "RTA>Spike RTA" indicates that the denuded zone thickness in wafers processed according to the rapid thermal anneal conditions in FIG. 11A was greater than the denuded zone thickness in wafers processed according to the spike rapid thermal anneal conditions in FIG. 11A. Additionally, for the denuded zone thickness results, "1,175>1,200=1,250" indicates that the denuded zone thickness in wafers processed at a peak temperature of 1,175° C. was greater than the denuded zone thickness in wafers processed at a peak temperature of 1,200° C., which was, in turn, about equal to the denuded zone thickness in wafers processed at a peak temperature of 1,250° C.

Referring to FIG. 11B, it is apparent that spike rapid thermal anneal processing according to an embodiment increased BMD values significantly as compared to rapid thermal anneal processing, while providing a denuded zone having a thickness less than that provided by rapid thermal anneal processing. In further detail, a peak temperature of 1,250° C. provided better BMD values than a peak temperature of 1,200° C., and each of the 1,250° C. and 1,200° C. peak temperatures of the spike rapid thermal anneal according to an embodiment provided significantly better BMD values than a peak temperature of 1,175° C. of the rapid thermal anneal.

BMD values were generally the same for preheating temperatures of 800° C. and 650° C. BMD values were generally the same for preheating times in excess of 15 seconds. BMD values were also generally the same for average heating rates of 100° C. and 250° C. although, as noted above, spike rapid thermal anneal according to an embodiment provided better BMD values than rapid thermal anneal. BMD values were better for the cooling rates of the spike rapid thermal anneal process than for the cooling rate of the rapid thermal anneal process, improving monotonically as the cooling rates increased from 33° C. (rapid thermal anneal) to spike rapid thermal anneal values of 75° C., 80° C., and 85° C.

As discussed above, it is also apparent that spike rapid thermal anneal processing according to an embodiment improved the denuded zone thickness (i.e., a better DZ result in FIG. 11B indicates a thinner DZ), as the DZ thickness was less for spike rapid thermal anneal as compared to rapid thermal anneal processing. In further detail, a peak temperature of 1,250° C. provided generally the same DZ values as a peak temperature of 1,200° C., and each of the 1,250° C. and 1,200° C. peak temperatures of the spike rapid thermal anneal according to an embodiment provided better DZ values (i.e., thinner denuded zones) than a peak temperature of 1,175° C. of the rapid thermal anneal.

DZ values were generally the same for preheating temperatures of 800° C. and 650° C. DZ values were generally the same for all preheating times. DZ values were also generally the same for average heating rates of 200° C. and 250° C. DZ values were better for the cooling rates of the spike rapid thermal anneal process than for the cooling rate of the rapid thermal anneal process, improving (i.e., providing thinner denuded zones) monotonically as the cooling rates increased from 33° C. (rapid thermal anneal) to spike rapid thermal anneal values of 75° C., 80° C. and 85° C.

As shown in FIG. 11B, uniformity of BMD density was generally greater for wafers processed using the rapid thermal anneal conditions shown in FIG. 11A than for wafers processed using the spike rapid thermal anneal conditions shown in FIG. 11A.

The data discussed above in connection with FIGS. 11A and 11B demonstrate the beneficial effects of the rapid cooling rate of the spike rapid thermal anneal process. Notably, BMD density increased and denuded zone depth decreased as the cooling rate was increased. Without intending to be bound by theory, it is believed that these results are the result of vacancy out-diffusion depth being a function of the cooling rate.

Figure 12:
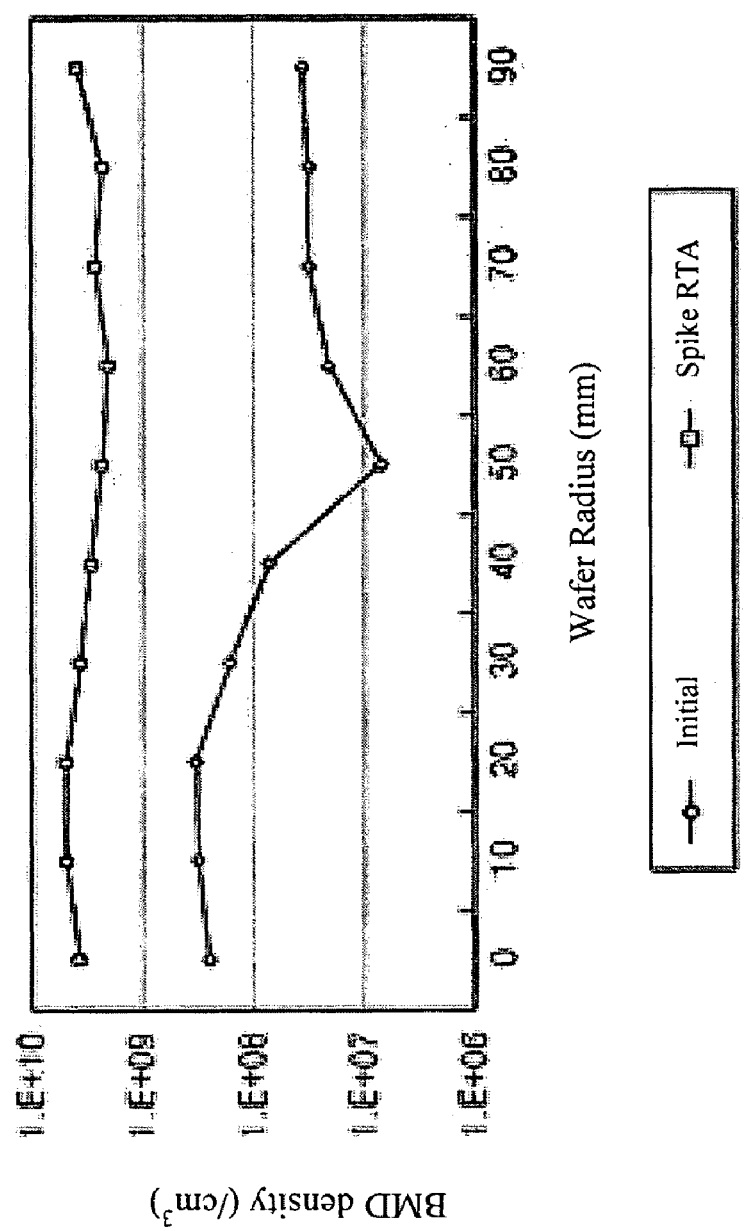
FIG. 12 illustrates the effects on uniformity of BMD density in a wafer processed using spike rapid thermal anneal according to an embodiment.

FIG. 12 illustrates the effects on the uniformity of BMD density in a wafer processed using spike rapid thermal anneal according to an embodiment. Referring to FIG. 12, the lower trace shows initial BMD densities relative to a radial direction of the wafer (the initial values are represented by diamonds ◊). As shown in FIG. 12, the initial values were non-uniform and exhibited a significant minimum at a radius of approximately 50 mm from the center of the wafer, the minimum being nearly 100-fold less that the BMD maximum. In contrast, as indicated by the upper trace in FIG. 12, after the wafer was processed using spike rapid thermal anneal according to an embodiment, the BMD densities were not only higher, but were significantly more uniform than the initial values. Notably, in contrast to the initial values, BMD densities in the processed wafer varied by much less than a factor of 10 throughout the extent of the measurement region.

Figure 13A:
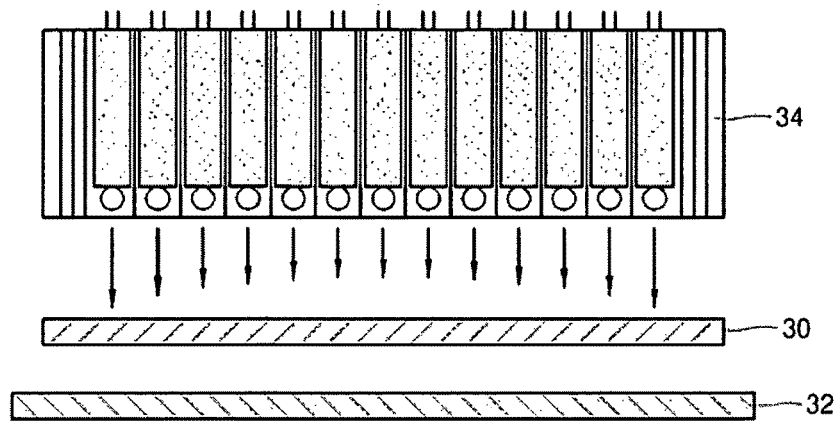
FIGS. 13A and 13B illustrate cross-sectional and plan views, respectively, of an apparatus for performing spike rapid thermal anneal according to an embodiment.
Figure 13B:
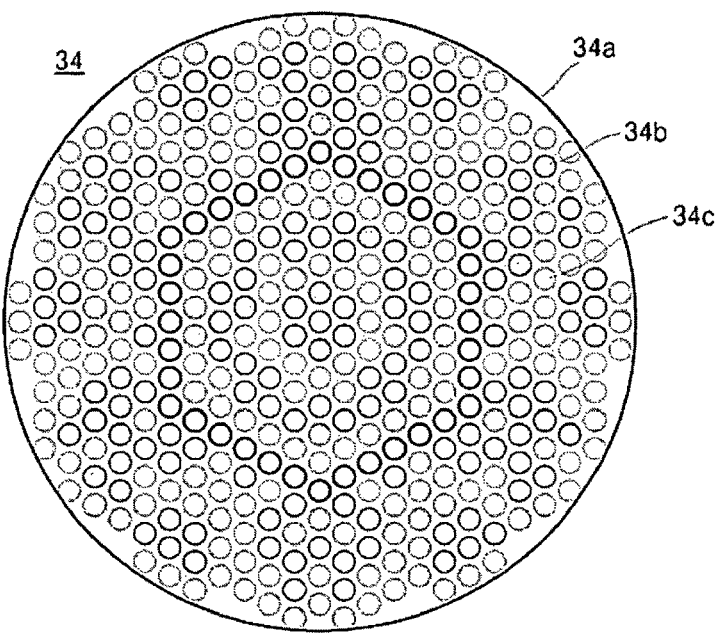

FIGS. 13A and 13B illustrate cross-sectional and plan schematic views, respectively, of an apparatus for performing spike rapid thermal anneal according to an embodiment. Referring to FIG. 13A, a wafer 30 having a predetermined nucleation site profile according to an embodiment may be formed using spike rapid thermal anneal according to an embodiment. Heating the wafer may be performed using heating unit 34, which may include, e.g., a plurality of lamps. The heating unit 34 may be, e.g., an Applied Materials Centura RTP equipment. The heating unit 34 may be disposed so as to heat the active surface of the wafer, i.e., the surface upon which devices will be formed. Referring to FIG. 13B, the heating unit 34 may have lamps arranged in a honeycomb pattern. The heating unit 34 may include supports 34a, heating modules 34b, e.g., lamps, and temperature sensors 34c.

Referring again to FIG. 13A, cooling the back side of the wafer may be performed using cooling unit 32. The cooling unit 32 may be controlled so that cooling is initiated once heating has ended, i.e., in the spike rapid thermal anneal process, cooling may not be performed while the wafer is being heated. The cooling unit 32 may provide a gas stream to the back side of the wafer, the gas stream acting as a heat sink that draws heat from the wafer into the gas. In an implementation, the gas stream may be helium. Additionally, a process gas, e.g., a nitrogen/ammonia mixture or an argon/ammonia mixture, may be provided to the front surface of the wafer during the spike rapid thermal anneal process.

Example embodiments have been disclosed herein, and although specific terms are employed, they are used and are to be interpreted in a generic and descriptive sense only and not for purpose of limitation. For example, spike rapid thermal anneal according to an embodiment may be used for other purposes than generating a predetermined nucleation site profile in a wafer. Such other purposes may include, e.g., formation of a shallow junction device having a region doped with boron. Boron activation may be required to activate the boron impurities doped in the wafer. However, excessive heating may cause boron to diffuse, which may be undesirable. Thus, spike rapid thermal anneal according to an embodiment may be employed to activate the boron impurities without causing undue diffusion of the boron impurities. Accordingly, it will be understood by those of ordinary skill in the art that various changes in form and details may be made without departing from the spirit and scope of the present invention as set forth in the following claims.

What is claimed is:

1. A method of processing a semiconductor wafer, comprising:
preheating the wafer to a preheating temperature that is less than a peak temperature;
using front side heating to heat the wafer from the preheating temperature to the peak temperature at a first ramp rate that averages about 100° C. per second or more; and
immediately after heating the wafer from the preheating temperature to the peak temperature, cooling the wafer at a second ramp rate that averages about −70° C. per second or more from the peak temperature to the preheating temperature,
wherein:
the peak temperature is about 1,100° C. or more, and
cooling the wafer at the second ramp rate includes back surface cooling by directing a gas stream at a back surface of the wafer, the gas stream being emitted from a cooling unit that faces the back surface of the wafer, the back surface cooling being begun while heating the wafer at the first ramp rate.

2. The method as claimed in claim 1, wherein the first ramp rate averages about 250° C. per second or more.

3. The method as claimed in claim 1, wherein heating the wafer from the preheating temperature to the peak temperature and cooling the wafer is performed in a combined time of about 4 seconds or less.

4. The method as claimed in claim 3, wherein the first ramp rate averages about 250° C. per second or more.

5. The method as claimed in claim 3, wherein the second ramp rate averages about −100° C. per second or more.

6. The method as claimed in claim 1, wherein the preheating temperature is about 800° C. or less, heating the wafer from an initial temperature to the preheating temperature is performed in a time of about 60 seconds or less, and cooling the wafer at the second ramp rate is continued until the wafer is about room temperature.

7. The method as claimed in claim 1, wherein the preheating temperature is between about 500° C. and about 800° C.

* * * * *